United States Patent [19]

Wen

[11] Patent Number: 5,933,735

[45] Date of Patent: Aug. 3, 1999

[54] SEMICONDUCTOR READ-ONLY MEMORY DEVICE AND METHOD OF FABRICATING THE SAME

[75] Inventor: Jemmy Wen, Hsinchu, Taiwan

[73] Assignee: United Microelectronics Corp., Taiwan

[21] Appl. No.: 08/839,629

[22] Filed: Apr. 15, 1997

[30] Foreign Application Priority Data

Jan. 16, 1997 [TW] Taiwan ................................. 86100449

[51] Int. Cl.⁶ ................................................. H01L 21/70
[52] U.S. Cl. ......................... 438/275; 438/276; 438/277; 438/278
[58] Field of Search .................................... 438/275, 276, 438/277, 278

[56] References Cited

U.S. PATENT DOCUMENTS

| | | | |
|---|---|---|---|
| 5,330,924 | 7/1994 | Huang et al. | 437/43 |
| 5,446,299 | 8/1995 | Acovic et al. | 257/316 |
| 5,523,251 | 6/1996 | Hong | 437/48 |
| 5,539,234 | 7/1996 | Hong | 257/390 |

FOREIGN PATENT DOCUMENTS 0 727 820 A1   8/1996   European Pat. Off. .

Primary Examiner—Joni Chang

Attorney, Agent, or Firm—Finnegan, Henderson, Farabow, Garrett & Dunner, L.L.P.

[57] ABSTRACT

A ROM (read-only memory) device of the type including an array of MOSFET (metal-oxide semiconductor field-effect transistor) memory cells and a method for fabricating the same are provided. The method allows for better planarization of the wafer surface of the ROM device with increased gap fill capability. Further, the bit lines are formed by forming a substantially grid-like structure including a plurality of substantially parallel-spaced first portions oriented in a first direction and a plurality of substantially parallel-spaced second portions oriented in a second direction. The first portions serve as bit lines and the second portions serve as channels. In the code definition and implantation process, a selected number of the channel regions are diffused with impurities so as to set the associated memory cells with a first threshold voltage representing the storage of a first binary digit; while the threshold voltage of all the other channel regions that are not diffused with impurities are set to a second threshold voltage representing the storage of a second binary digit. In the method of fabricating the ROM device, the bit lines are not formed by diffusing impurities into the silicon substrate. As a result of this, the drawbacks of lateral diffusion, junction leakage, and reduced breakdown voltage are not experienced when the ROM device is further miniaturized.

14 Claims, 7 Drawing Sheets

SEMICONDUCTOR READ-ONLY MEMORY DEVICE AND METHOD OF FABRICATING THE SAME

BACKGROUND OF THE INVENTION

1. Field of the Invention

This invention relates to semiconductor memory devices, and more particularly, to a ROM (read-only memory) device of the type including an array of MOSFET (metal-oxide semiconductor field-effect transistor) memory cells for data storage and a method of fabricating the same.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the data to be permanently stored in ROMs is usually first defined by the customer and then finished to the factory to be programmed into the ROMs.

Most ROMs are identical in semiconductor structure except for the different data stored therein. Therefore, the ROM devices can be fabricated up to the stage ready for the programming and then the semi-finished products can be stocked in inventory awaiting customer orders. The customer then furnishes the data to the factory where the data are to be stored into the semi-finished ROMs by using the so-called mask programming process. This procedure is now a standard method in the semiconductor industry for fabricating ROMs.

In most ROMs, metal-oxide semiconductor field-effect transistors (MOSFET) are used as the memory cells for data stored. In the mask programming stage, impurities are selectively diffused into specific channels in the MOSFET memory cells so as to change the threshold voltage thereof, thereby setting the MOSFET memory cells to ON/OFF states representing different binary data. The MOSFET memory cells are connected to the external circuits via a plurality of polysilicon-based word lines and bit lines. The channel regions are located beneath the word lines and between each pair of adjacent bit lines. Whether one MOSFET memory cell is set to store a binary digit of 0 or 1 is dependent on whether the associated channel is diffused with impurities or not. If the associated channel is diffused with impurities, the MOSFET memory cell is set to have a low threshold voltage, effectively setting the MOSFET memory cell to a permanently-ON state representing the storage of a binary digit of 0, for example; otherwise, the MOSFET memory cell is set to have a high threshold voltage, effectively setting the MOSFET memory cell to a permanently-OFF state representing the storage of a binary digit of 1.

Referring to FIG. 1, there is shown the circuit diagram of a conventional mask ROM device 10, which includes a plurality of crosswise-arranged parallel-spaced word lines [WL0, WL1, WL2, WL3] and a plurality of lengthwise-arranged parallel-spaced bit lines [BL0, BL1, BL2, BL3, BL4]. Each segment of the word lines located between one neighboring pair of the bit lines is the location where one MOSFET memory cell is formed. The binary data stored in each MOSFET memory cell is dependent on the threshold voltage of the same. For instance, if one MOSFET memory cell is custom-made with a low threshold voltage, it means that this MOSFET memory cell is set to a permanently-ON state representing the permanent storage of a binary digit of 0, for example. Conversely, if the MOSFET memory cell is custom-made with a high threshold voltage, it means that this MOSFET memory cell is set to a permanently-OFF state representing the permanent storage of a binary digit of 1, for example. In FIG. 1, for example, those memory cells that are set to store a binary digit of 1 are indicated by the labeling of a black box between the source/drain electrodes, as indicated by the one labeled with the reference numeral 14. Conversely, those memory cells that are not labeled with a black box are set to store a binary digit of 0, as indicated by the one labeled with the reference numeral 12.

To read data from the ROM device, a specific potential is applied to the corresponding bit lines and word lines. For instance, to read data from the memory cell 12 (which has a low threshold voltage indicating the storage of the binary data of 0), a potential is applied to the gate of the memory cell 12 via the word line WL0 and the drain of the same via the bit line BL0. Since the memory cell 12 is custom-made with a low threshold voltage, the applied potential will turn ON the MOSFET memory cell, thus causing a change in the current flowing in the bit line BL0. By contrast, since the memory cell 14 is custom-made with a high threshold voltage, the applied potential will not cause a change in the current flowing in the corresponding bit line BL2. By detecting the current changes in the bit lines, the external circuitry can determine whether the data is 0 or 1.

Referring to FIG. 2, there is shown a top view of the layout of part of the conventional ROM device of FIG. 1. This ROM device is based on a P-type silicon substrate 20. Through ion implantation with an N-type impurity material at selected areas on the silicon substrate 20, a plurality of parallel-spaced buried bit lines 22, 26 and complementary bit lines 24, 28 are formed. The buried bit lines 22, 26 are connected to a voltage source V, while the complementary bit lines 24, 28 are connected to ground. The ROM device is further formed with a plurality of parallel-spaced word lines WL0, WL1 intercrossing the buried bit lines 22, 26 and complementary bit lines 24, 28 substantially at right angles. This forms a plurality of MOSFET memory cells 30 (as indicated by the dashed boxes in FIG. 2) which have a low threshold voltage, and a plurality of MOSFET memory cells 32 which have a high threshold voltage.

Referring to FIG. 3, there is shown a schematic sectional diagram of a part of the ROM device of FIG. 2. This sectional diagram is used in particular to depict the programming of data into the ROM device. First, a silicon substrate 15 is prepared. Then, an N-type impurity material, such as arsenic (As), is diffused by means of ion implantation into selected regions of the silicon substrate 15 to form a plurality of parallel and substantially equally spaced $N^+$ diffusion regions 11 serving as a plurality of bit lines. One channel region 16 is formed between each neighboring pair of the $N^+$ diffusion regions (bit lines) 11. Subsequently, a thermal oxidation process is conducted on the wafer. Due to different oxidation rates at different regions, a thick oxidation layer 17a (which serves as an isolation layer) is formed over the $N^+$ diffusion regions (bit lines) 11, while a thin oxidation layer 17b is formed over each channel region 16. After that, a plurality of parallel-spaced polysilicon layers 13 (which serve as word lines) are formed over the wafer in such as manner as to intercross the underlying $N^+$ diffusion regions (bit lines) 11 substantially at right angles ( only one of the polysilicon layers 13 is visible in the sectional diagram of FIG. 3 ). This completes the semi-finished product of the ROM device.

In the mask programming process, a mask 19 covers the top surface of the semi-finished product of the ROM device. This mask 19 is predefined to form a plurality of openings to expose those channel regions that are associated with the MOSFET memory cells that are to be set to a permanently-ON state. A P-type impurity material, such as boron, is diffused by ion implantation through the openings in the mask 19 into the corresponding channel regions. This completes the so-called code implant process.

In the finished product of the ROM device, the doped channels cause the associated MOSFET memory cells to have a low threshold voltage, thus setting them to a permanently-ON state representing the storage of a binary digit of 0. On the other hand, the undoped channels cause the associated MOSFET memory cells to have a high threshold voltage, thus setting them to a permanently-OFF state representing the storage of a binary digit of 1.

The foregoing ROM device, however, has the following two drawbacks. First, when the ROM device is further miniaturized, the application of a high concentration of impurities to selected channel regions could cause the undesired phenomena of lateral diffusion, junction leakage, and reduced breakdown voltage. This is due to the fact that the buried bit lines in the conventional ROM device are formed by implanting impurities into the silicon substrate. Second, since the process for fabricating the conventional ROM device involves the use of thermal oxidation to form the isolating oxidation layers, the planarization of the wafer surface is not very satisfactory. Poor planarization adversely affects the performance of the ROM device.

SUMMARY OF THE INVENTION

It is therefore a primary objective of the present invention to provide a semiconductor structure for a ROM device in which the above-mentioned drawbacks are substantially eliminated.

It is another objective of the present invention to provide a method for fabricating the foregoing ROM device.

In accordance with the foregoing and other objectives of the present invention, a semiconductor structure for a ROM device and a method for fabricating such a ROM device are provided.

The semiconductor structure of the ROM device includes:
a semiconductor substrate;
a first insulating layer formed over the substrate;
a semiconductor layer formed over the first insulating layer, the semiconductor layer being selectively removed to form a plurality of substantially parallel-spaced bit lines oriented in a first direction and a plurality of substantially parallel-spaced channel regions oriented in a second direction substantially at right angle with respect to the first direction, the removed portions of the semiconductor layer forming a plurality of recesses;
a plurality of second insulating layers formed in the recesses;
a third insulating layer covering the semiconductor layer and the second insulating layers; and
a plurality of substantially parallel-spaced conductive layers formed over the third insulating layer, the conductive layers being oriented substantially in the second direction and positioned above the channel regions.

In the foregoing ROM device, the conductive layer is formed by a conductive material selected from the group consisting of polysilicon, titanium, tungsten, and aluminum; and the first, second, and third insulating layers are silicon oxide layers. The parallel-spaced bit lines are spaced substantially at equal intervals.

In the code definition and implantation process, a selected number of the channel regions are formed with a first threshold voltage representing the storage of a first binary digit, and all the other channel regions are formed with a second threshold voltage representing the storage of a second binary digit.

Alternatively, in another embodiment, the ROM device includes:
a semiconductor substrate;
a first insulating layer formed over the substrate;
a semiconductor layer formed into a substantially grid-like structure over the first insulating layer, the grid-like structure including a plurality of substantially parallel-spaced bit lines oriented in a first direction and a plurality of substantially parallel-spaced channel regions oriented in a second direction substantially at a right angle with respect to the first direction;
a plurality of second insulating layers formed in the spaces between the bit lines and the channel regions;
a third insulating layer covering the semiconductor layer and the second insulating layers; and
a plurality of substantially parallel-spaced conductive layers formed over the third insulating layer to serve as a plurality of word lines, the conductive layers being oriented in the second direction and positioned above the channel regions.

The foregoing ROM device is fabricated by a method in accordance with the invention. This method includes the following steps:

(1) forming a first insulating layer over a semiconductor substrate;

(2) forming a semiconductor layer over the first insulating layer, and then conducting an ion implantation process on the semiconductor layer so as to adjust the concentration thereof;

(3) performing a photolithographic and etching process on the semiconductor layer so as to remove selected portions of the semiconductor layer to form a substantially grid-like structure having a plurality of substantially parallel-spaced first portions oriented in a first direction and a plurality of substantially parallel-spaced second portions oriented in a second direction substantially at right angle with respect to the first direction, the removed portions of the semiconductor layer forming a plurality of recesses;

(4) forming a plurality of planarized second insulating layers to fill up the recesses;

(5) forming a photoresist layer which is selectively removed to define the first portions of the grid-like structure as bit lines and defining the second portions of the grid-like structure as channel regions;

performing an ion implantation process so as to diffuse impurities into the bit lines so as to increase the conductivity thereof; and then removing the photoresist layer;

(6) forming a third insulating layer covering the semiconductor layer and the second insulating layers;

(7) forming a conductive layer over the third insulating layer, and then removing selected portions of the conductive layer to form a plurality of substantially parallel-spaced word lines oriented in the second direction and positioned substantially above the channel regions; and (8) performing a code define and implant process to program data into the ROM device.

The ROM device of the invention offers some benefits over the prior art. First, planarization of the wafer surface can be achieved with increased gap fill capability. Voids in the top surface of the wafer are thus substantially reduced. Second, since by the method of the invention, the bit lines are not formed by diffusing impurities into the silicon substrate, the drawbacks of lateral diffusion, junction leakage, and reduced breakdown voltage are not experienced when the ROM device is further miniaturized.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 4A through 4J are schematic diagrams depicting the steps involved in the method according to the present invention for fabricating a ROM device of the type including a plurality of MOSFET memory cells for storing data.

Figure 1:
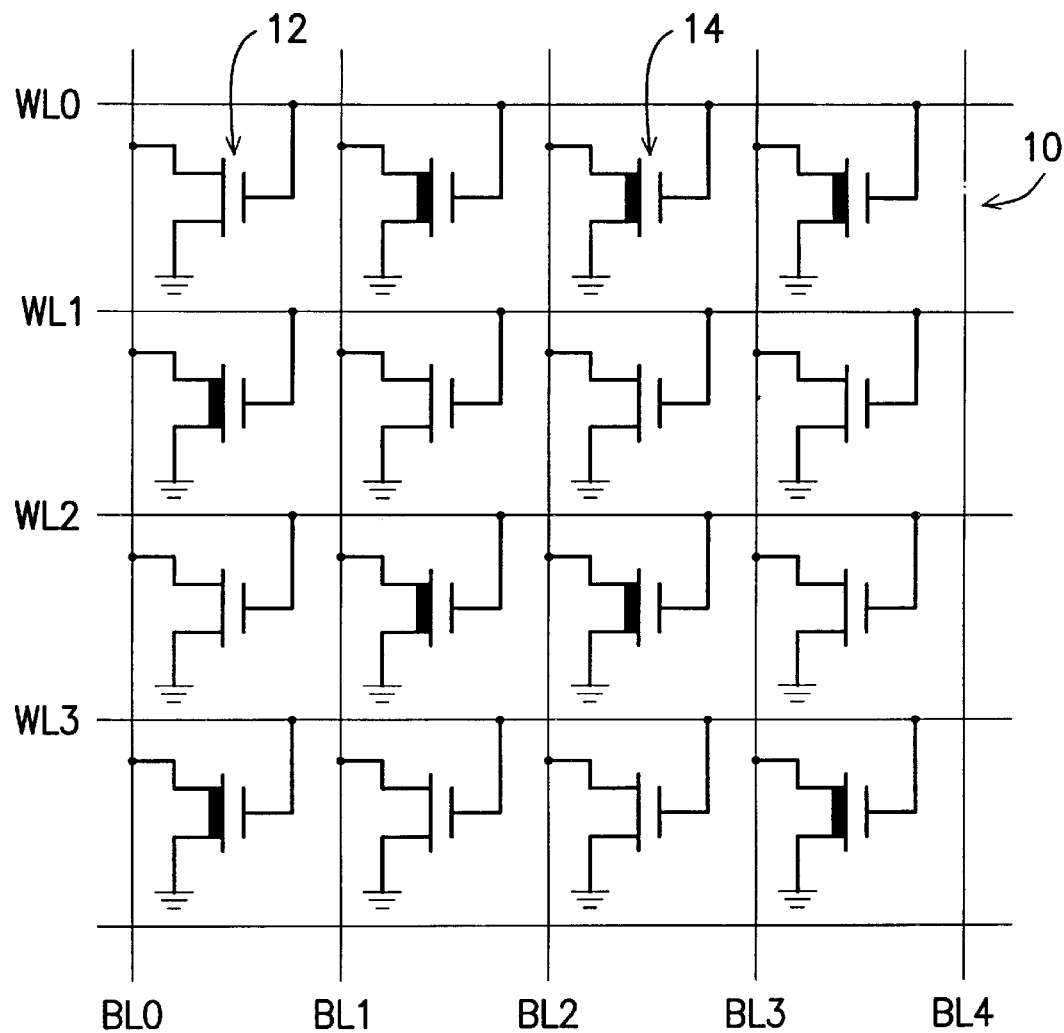
FIG. 1 is a schematic circuit diagram of a conventional ROM device.
Figure 2:
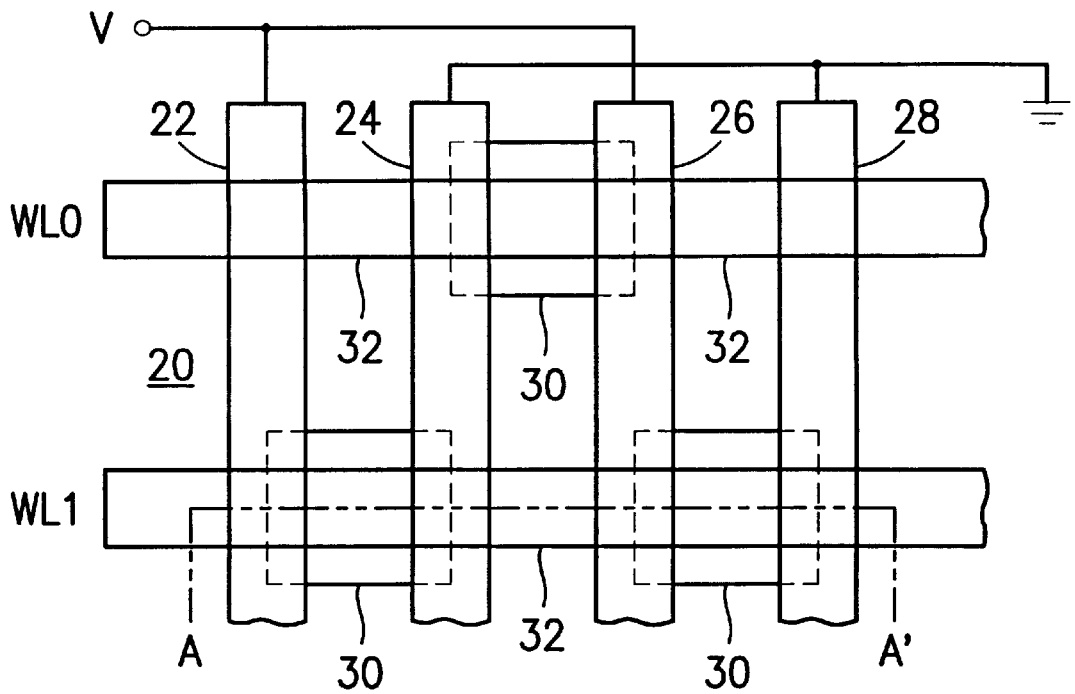
FIG. 2 is a top view of the layout of part of the ROM device of FIG. 1.
Figure 3:
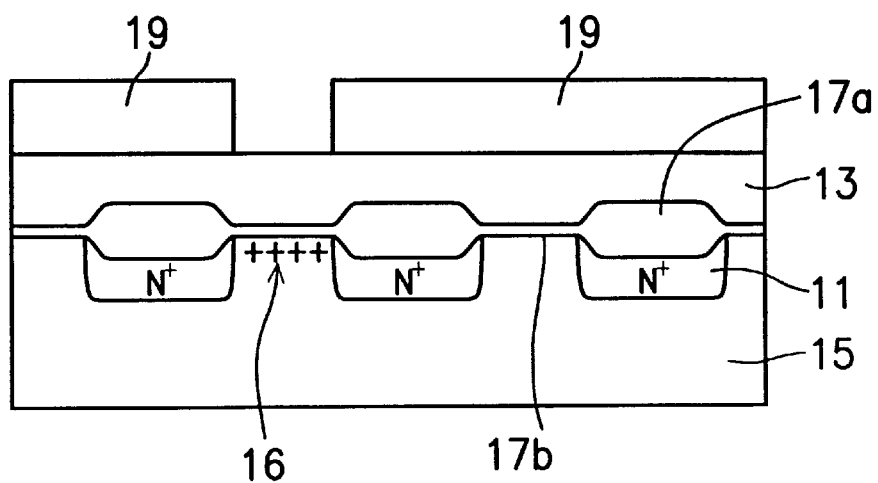
FIG. 3 is a schematic sectional diagram showing the semiconductor structure of the ROM device of FIG. 2 cutting through the line A–A'.
Figure 4A:
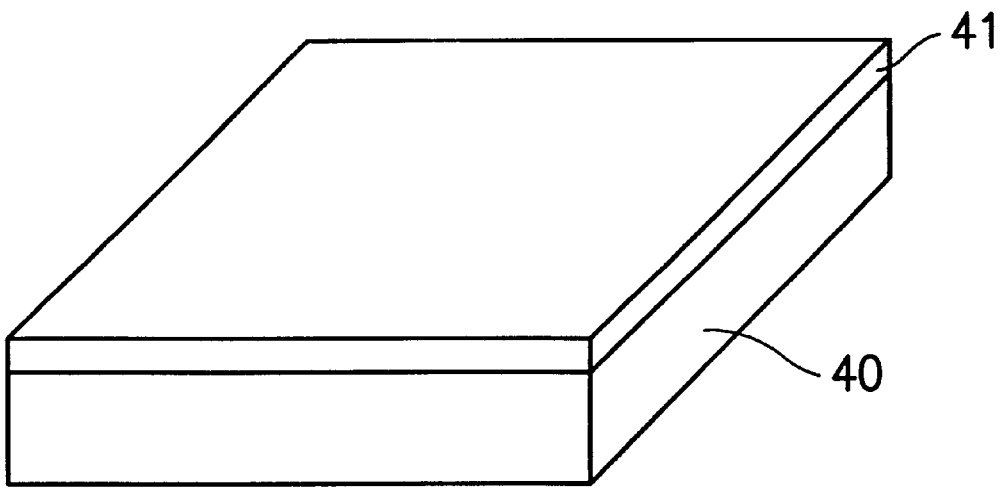
FIGS. 4A through 4J are schematic diagrams used to depict the steps involved in the method according to the present invention for fabricating a ROM device.

Referring first to FIG. 4A, in the first step, a semiconductor substrate 40 is prepared. The substrate 40 can be either P-type or N-type. Subsequently, an oxidation layer 41 is formed over the substrate 40 to serve as an insulating layer.

Figure 4B:
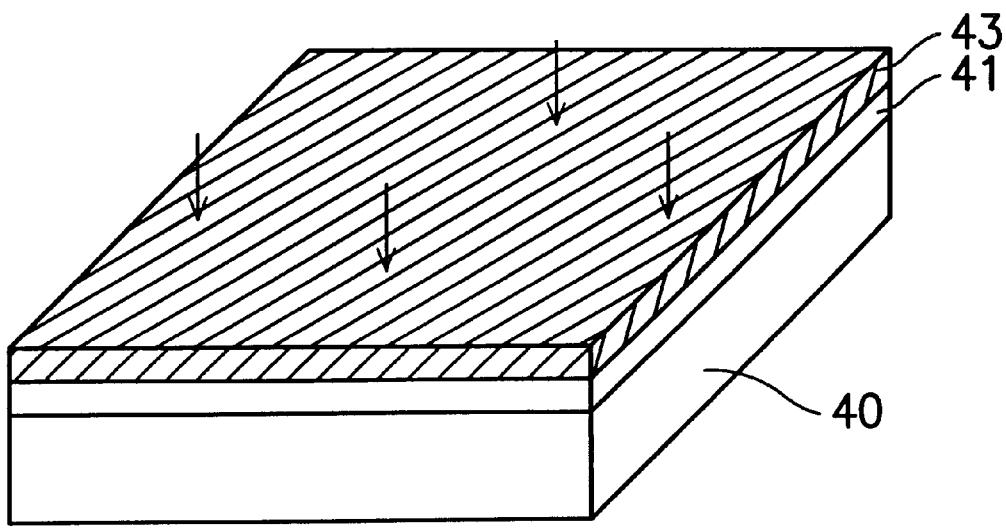

Referring next to FIG. 4B, in the subsequent step, a semiconductor layer 43 is deposited over the oxidation layer 41. This semiconductor layer 43 can be a layer of intrinsic amorphous silicon or polysilicon. Further, the semiconductor layer 43 can be either P-type or N-type. One method for forming the semiconductor layer 43 is to first conduct a PECVD (plasma-enhanced chemical-vapor deposition) process on the wafer by using the vapor of $SiH_4$ at a temperature of about 350° C. to 575° C. to deposit a layer of intrinsic amorphous silicon or polysilicon, and then conduct an ion implantation process on the intrinsic amorphous silicon layer so as to diffuse an impurity material, such as boron, into the intrinsic amorphous silicon layer to adjust the concentration thereof.

Figure 4C:
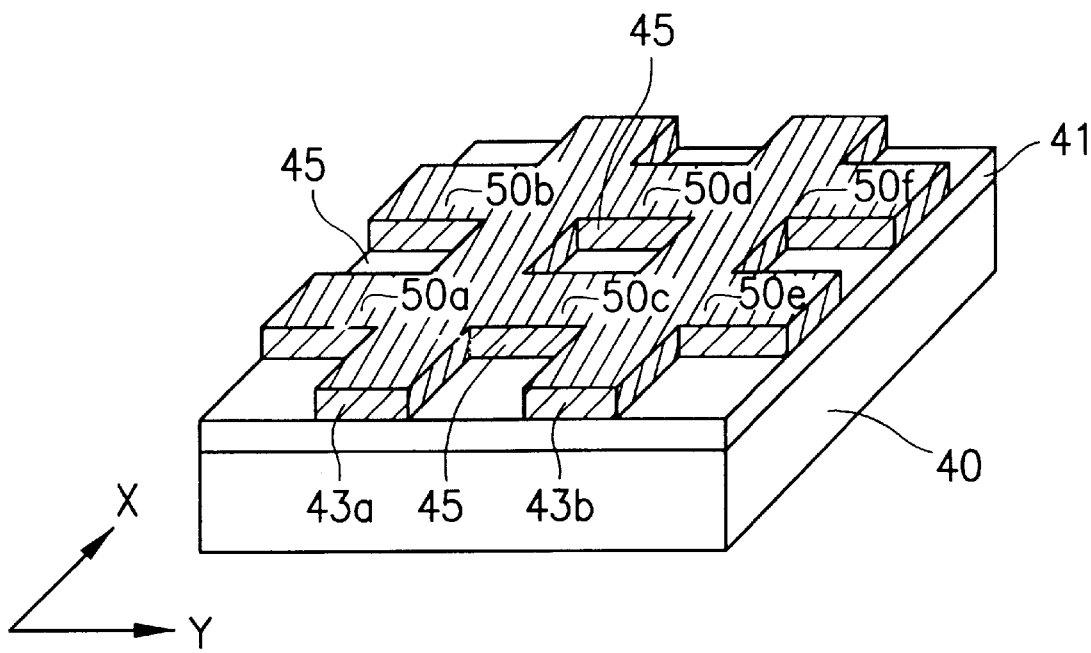

Referring further to FIG. 4C, in the subsequent step, a photolithographic and etching process is conducted on the wafer so as to etch away selected portions of the semiconductor layer 43 to form a substantially grid-like structure including a plurality of parallel-spaced first semiconductor layers oriented in the X direction (which are designated by the reference numerals 43a, 43b), and a plurality of parallel-spaced second semiconductor layers oriented in the Y direction (which are designated by the reference numerals 50a, 50b, 50c, 50d, 50e, 50f). The first semiconductor layers 43a, 43b are to be used as a plurality of bit lines for the ROM device, while the second semiconductor layers 50a, 50b, 50c, 50d, 50e, 50f are to be used as the channels of the MOSFET memory cells in the ROM device. The removed portions leave a plurality of recesses 45 in the grid-like structure.

Figure 4D:
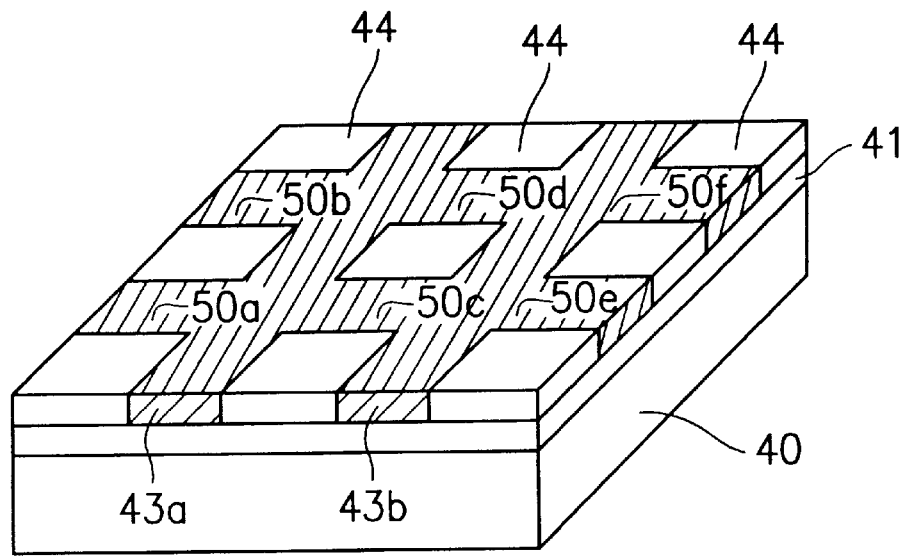

Referring next to FIG. 4D, subsequently, an insulating layer 44, such as an oxidation layer, is formed to fill up each of the recesses 45. For planarization purposes, the spin-on glass (SOG) process, for example, is used to first deposit an insulating material, such as silicon oxide, in the form of a liquid to cover the top surface of the wafer in the recesses 45 (FIG. 4C), and then the deposited layers are etched back to planarize of the top surface thereof. Alternatively, the chemical mechanical polish (CMP) technique can be used for planarization of the insulating layer 44.

Figure 4E:
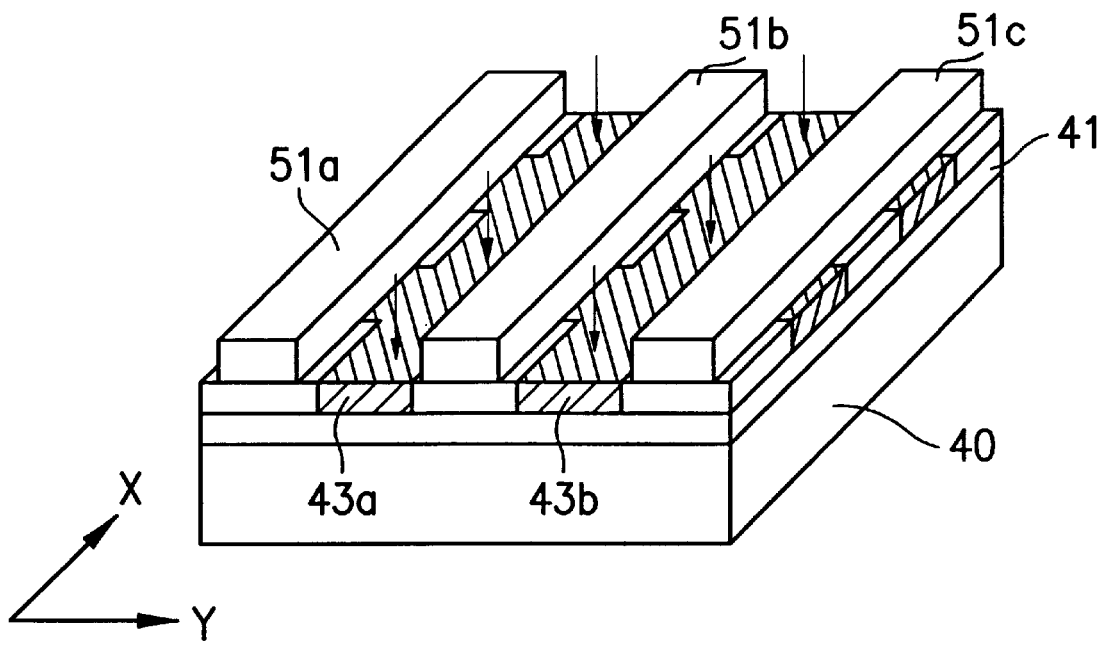

Referring further to FIG. 4E, the subsequent step is to define and form a plurality of bit lines and channel regions on the wafer. First, a plurality of elongated photoresist layers 51a, 51b, 51c are formed by a photolithographic and etching process over the regions between the first semiconductor layers 43a, 43b. This defines the first semiconductor layers 43a, 43b as bit lines, and the second semiconductor layers 50a, 50b, 50c, 50d, 50e, 50f, which are covered by the photoresist layers 51a, 51b, 51c, as channels. Then, an impurity material, such as N-type arsenic (As), is diffused by ion implantation into the first semiconductor layers 43a, 43b so as to form a plurality of $N^+$ diffusion regions with increased conductivity to serve as bit lines. After this, the photoresist layers 51a, 51b, 51c are removed.

Figure 4F:
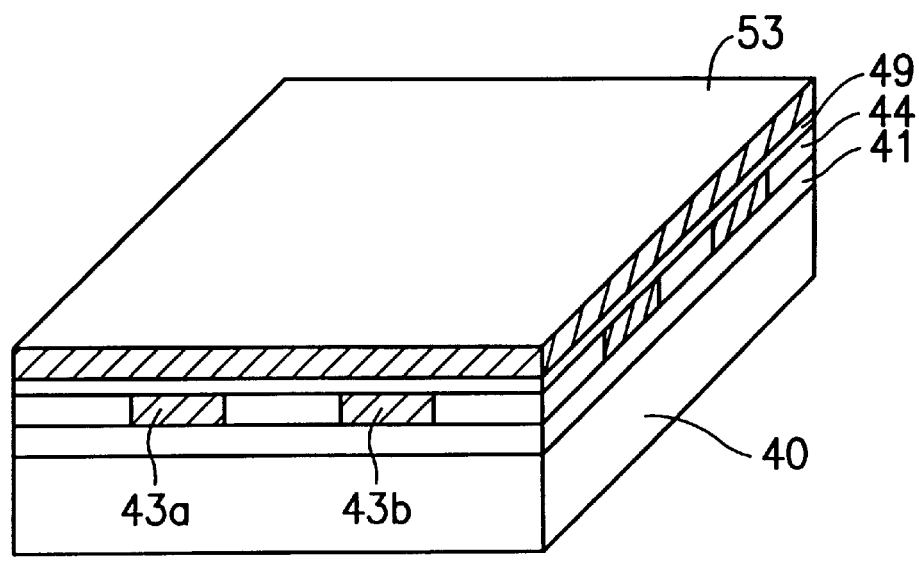

Referring next to FIG. 4F, in the subsequent step, an insulating layer 49, such as a layer of silicon oxide or a layer of the ONO (silicon dioxide/silicon nitride/silicon dioxide) structure, is first deposited over the entire top surface of the wafer, and then a conductive layer 53 is deposited over the insulating layer 49. The conductive layer 53 is formed by using a conductive material selected from the group consisting of polysilicon, tungsten, titanium, and aluminum deposited by the physical vapor deposition (PVD) or chemical-vapor deposition (CVD) method, for example.

Figure 4G:
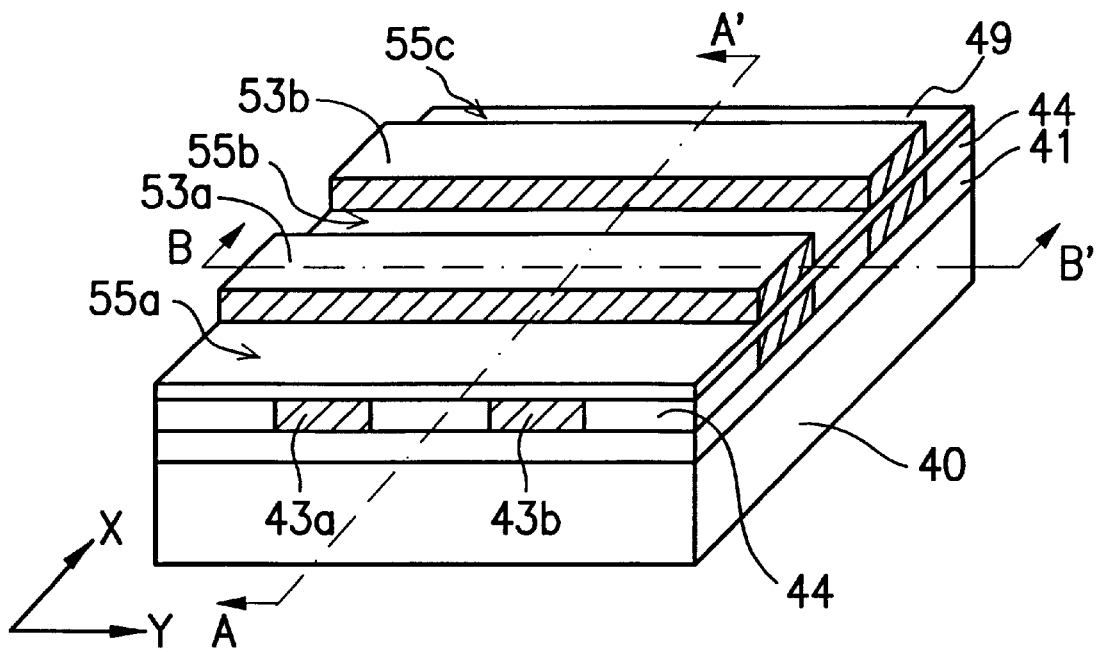

Referring next to FIG. 4G, the subsequent step is to define and form a plurality of word lines for the ROM device. First, a photolithographic and etching process is performed on the wafer so as to remove selected portions of the conductive layer 53. The remaining portions of the conductive layer 53 are elongated parallel-spaced strips oriented in the Y direction, which serve as a plurality of word lines 53a, 53b. These word lines 53a, 53b are substantially located right above the second semiconductor layers (channels) 50a, 50b, 50c, 50d, 50e, 50f. The removed portions of the conductive layer 53 leave a plurality of grooves 55a, 55b, 55c between the word lines 53a, 53b. This constitutes a plurality of MOSFET memory cells, each being associated with one of the second semiconductor layers (channels) 50a, 50b, 50c, 50d, 50e, 50f.

The foregoing steps complete the fabrication of a semi-finished product of the ROM device which is not yet mask programmed to store permanent data. After receiving orders from the customer, a mask programming process is conducted on the semi-finished product of the ROM device so as to store the customer-supplied binary code permanently in the ROM device. This process will be described in full detail in the following paragraphs with reference to the ensuing FIGS. 4H, 4I, and 4J.

Figure 4H:
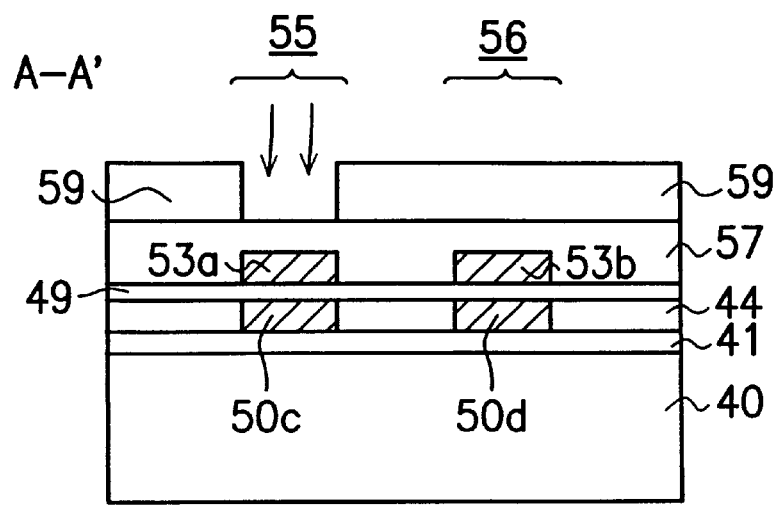
Figure 4I:
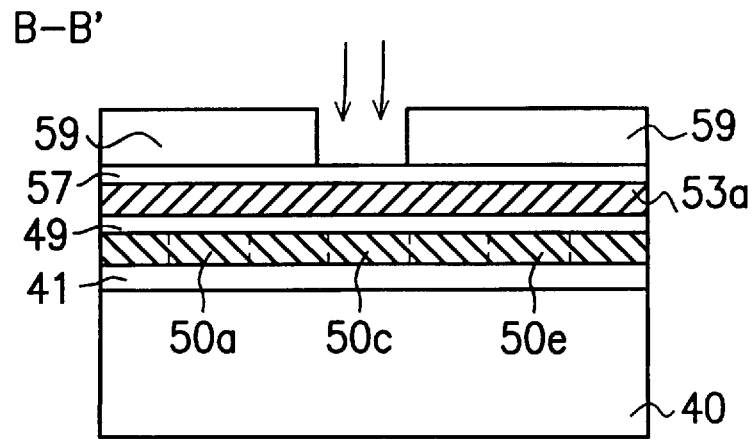

Referring together to FIGS. 4H and 4I (in which FIG. 4H shows a sectional diagram of the wafer of FIG. 4G cutting through the line A–A', while FIG. 4I shows another sectional diagram of the same cutting through the line B–B'), the subsequent step is to conduct the so-called code definition and implantation process on the wafer to set different threshold voltage levels to the selected MOSFET memory cells in the ROM device.

First, a dielectric layer 57 is deposited over the entire top surface of the wafer. Then, a photoresist layer 59 is formed over the dielectric layer 57. This photoresist layer 59 is predefined to form a plurality of openings which expose those areas above a number of selected channel regions that are associated with those MOSFET memory cells that are to be set to a permanently-ON state representing the storage of a binary digit of 0, for example.

In the case of FIG. 4H, for example, the photoresist layer 59 has one opening which exposes the area above the channel 50c while covering the area above the channel 50d. An ion implantation process is then conducted on the wafer so as to diffuse an impurity material, which is N-type if the substrate 40 is N-type and is P-type if the substrate 40 is P-type, into the exposed channel 50c. As a result of this, the MOSFET memory cell associated with the channel 50c will be set to a permanently-ON state, while the MOSFET memory cell associated with the channel 50d will be set to a permanently-OFF state. This completes the installation of binary code in the ROM device.

After this, conventional steps, including the forming of contacts, metallurgy, passivation, and packaging, are carried out to finish the product of the ROM device. These steps are standard processes in the manufacturing process, so that description thereof will not be further detailed.

Figure 4J:
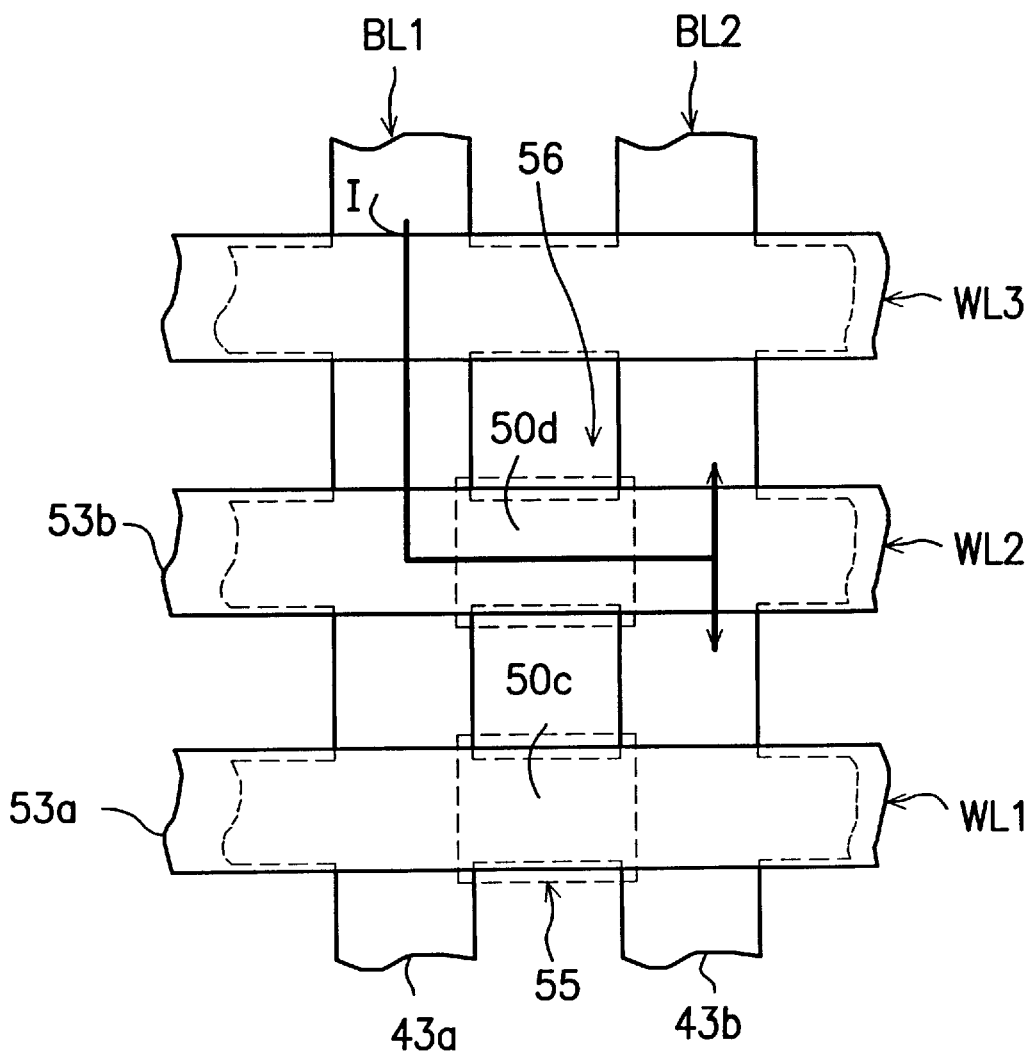

Referring further to FIG. 4J, there is shown a schematic top view of the finished product of the ROM device. As shown, this ROM device includes a plurality of parallel-spaced bit lines BL1, BL2 and a plurality of parallel-spaced overlaying word lines WL1, WL2, WL3 intercrossing the bit lines BL1, BL2 substantially at right angles. The channel 50c, which is diffused with impurities through the foregoing ion implantation, causes the associated MOSFET memory cell, which is designated by the reference numeral 55, to be set to a permanently-OFF state; whereas the channel 50d, which is not diffused with impurities, causes the associated MOSFET memory cell, which is designated by the reference numeral 56, is set to a permanently-ON state. As a result of this, when a potential is applied to the word line WL2, the channel 50d will be set to an ON-state, thus allowing the current to flow from the bit line BL1 to the bit line BL2.

In conclusion, the prevent invention offers some benefits over the prior art. First, since an SOG process or a CMP process, is utilized instead of the thermal oxidation process in the prior art to form the insulating layer 44, better planarization of the wafer surface can be achieved. In addition, since in the SOG process a dielectric material such as silicon oxide is used in the form of liquid to cover the top surface of the wafer, the gap fill capability for grooves in the top surface of the wafer is better than using the CVD method as in the prior art. Voids in the top surface of the wafer are thus substantially reduced.

Second, since by the method of the invention, the bit lines are not formed by diffusing impurities into the silicon substrate, the drawbacks of lateral diffusion, junction leakage, and reduced breakdown voltage are not experienced when the ROM device is further miniaturized.

The access operation to read data from the ROM device is performed by applying an electrical potential to the word lines and the bit lines and using sense amplifiers to detect the change in the current. This operation is the same as the conventional access method so that description thereof will not be further detailed.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method for fabricating a ROM device, comprising the steps of:

(1) forming a first insulating layer over a semiconductor substrate;

(2) forming a semiconductor layer over said first insulating layer;

(3) removing selected portions of said semiconductor layer to form a grid-like structure having a plurality of substantially parallel-spaced first portions oriented in a first direction and a plurality of substantially parallel-spaced second portions oriented in a second direction substantially at a right angle with respect to said first direction, the removed portions of said semiconductor layer forming a plurality of recesses;

(4) forming a plurality of second insulating layers which are filled in said recesses;

(5) defining the first portions of said grid-like structure as bit lines and defining said second portions of said grid-like structure as channel regions;

(6) forming a third insulating layer covering said semiconductor layer and said second insulating layers;

(7) forming a conductive layer over said third insulating layer, and then removing selected portions of said conductive layer to form a plurality of substantially parallel-spaced word lines oriented in said second direction and positioned substantially above said channel regions; and (8) performing a code definition and implantation process to program data into said ROM device.

2. The method of claim 1, wherein said step (2) includes the substep of:

conducting an ion implantation process on the semiconductor layer so as to adjust the concentration thereof.

3. The method of claim 1, wherein in said step (4), the second insulating layer is formed by an SOG process for planarization.

4. The method of claim 1, wherein in said step (4), the second insulating layer is formed by a CMP process for planarization.

5. The method of claim 1, wherein said step (5) includes the substeps of:

(i) forming a photoresist layer which is selectively removed to define the first portions of said grid-like structure as bit lines and defining said second portions of said grid-like structure as channel regions;

(ii) performing an ion implantation process so as to diffuse impurities into the bit lines so as to increase the conductivity thereof; and (iii) removing the photoresist layer.

6. The method of claim 1, wherein said step (8) includes the substeps of:

(i) depositing a dielectric layer over the entire top surface of the wafer;

(ii) forming a photoresist layer over the dielectric layer, wherein said photoresist layer in predefined to be formed with a plurality of openings which expose those areas above a number of selected channel regions that are associated with those MOSFET memory cells that are to be set to a permanently-ON state representing a first binary digit, with the unexposed channels regions associated with those MOSFET memory cells that are to be set to a permanently-OFF state representing a second binary digit;

(iii) performing an ion implantation process so as to diffuse an impurity material into the exposed channels; and (iv) removing the photoresist layer.

7. A method for fabricating a ROM device, comprising the steps of:

(1) forming a first insulating layer over a semiconductor substrate;

(2) forming a semiconductor layer over the first insulating layer, and then performing an ion implantation process on the semiconductor layer so as to adjust the concentration thereof;

(3) performing a photolithographic and etching process on the semiconductor layer so as to remove selected portions of the semiconductor layer to form a grid-like structure having a plurality of substantially parallel-spaced first portions oriented in a first direction and a plurality of substantially parallel-spaced second portions oriented in a second direction substantially at right angle with respect to the first direction, wherein the removed portions of the semiconductor layer form a plurality of recesses;

(4) forming a plurality of planarized second insulating layers to fill up the recesses;

(5) forming a photoresist layer which is selectively removed to define the first portions of the grid-like structure as bit lines and defining the second portions of the grid-like structure as channel regions;

performing an ion implantation process so as to diffuse impurities into the bit lines so as to increase the conductivity thereof; and then removing the photoresist layer;

(6) forming a third insulating layer covering the semiconductor layer and the second insulating layers;

(7) forming a conductive layer over the third insulating layer, and then removing selected portions of the conductive layer so as to form a plurality of substantially parallel-spaced word lines oriented in the second direction and positioned substantially above the channel regions; and (8) performing a code definition and implantation process to program data into the ROM device.

8. The method of claim 7, wherein in said step (2), the semiconductor layer is a layer of intrinsic amorphous silicon.

9. The method of claim 7, wherein in said step (2), the semiconductor layer is P-type.

10. The method of claim 7, wherein in said step (2), the semiconductor layer is N-type.

11. The method of claim 7, wherein in said step (8), a selected group of the channels are diffused with the impurity material so as to set the threshold voltage thereof to a first level representing the storage of a first binary digit in the associated memory cells.

12. The method of claim 11, wherein in said step (8), a selected group of the channels are not diffused with the impurity material so as to set the threshold voltage thereof to a second level representing the storage of a second binary digit in the associated memory cells.

13. The method of claim 7, wherein in said step (8), the impurity material is P-type.

14. The method of claim 7, wherein in said step (8), the impurity material is N-type.

* * * * *